(12) United States Patent
Harris

(10) Patent No.: US 7,782,613 B2
(45) Date of Patent: Aug. 24, 2010

(54) COOLING SYSTEM FOR A PORTABLE DEVICE

(75) Inventor: Scott C. Harris, Rancho Santa Fe, CA (US)

(73) Assignee: Harris Technology, LLC, Rancho Santa Fe, CA (US)

( * ) Notice: Subject to any disclaimer, the term of this patent is extended or adjusted under 35 U.S.C. 154(b) by 0 days.

(21) Appl. No.: 12/050,951

(22) Filed: Mar. 19, 2008

(65) Prior Publication Data

US 2009/0237881 A1 Sep. 24, 2009

(51) Int. Cl.
*H05K 7/20* (2006.01)
(52) U.S. Cl. ............... 361/695; 165/80.2; 165/122; 174/16.1
(58) Field of Classification Search ............... None
See application file for complete search history.

(56) References Cited

U.S. PATENT DOCUMENTS

| | | | |
|---|---|---|---|
| 6,005,770 A * | 12/1999 | Schmitt | 361/695 |
| 6,031,717 A * | 2/2000 | Baddour et al. | 361/679.49 |
| 6,579,168 B1 * | 6/2003 | Webster et al. | 454/184 |
| 6,587,340 B2 * | 7/2003 | Grouell et al. | 361/695 |
| 6,711,013 B2 * | 3/2004 | Wobig et al. | 361/679.47 |
| 7,345,875 B2 * | 3/2008 | Elkins | 361/695 |
| 7,352,575 B2 * | 4/2008 | Anderl et al. | 361/695 |
| 7,361,081 B2 * | 4/2008 | Beitelmal et al. | 454/184 |
| 7,408,772 B2 * | 8/2008 | Grady et al. | 361/679.48 |
| 7,580,259 B2 * | 8/2009 | Hsiao | 361/695 |
| 2007/0041157 A1 * | 2/2007 | Wang | 361/687 |

FOREIGN PATENT DOCUMENTS

JP 63-283048 11/1988

* cited by examiner

*Primary Examiner*—Boris L Chervinsky
(74) *Attorney, Agent, or Firm*—Law Office of Scott C Harris, Inc

(57) ABSTRACT

A cellular cooling part includes a number at least one movable part, that can be the removable flap or movable cover for a fan. The fan, for example, can be moved or opened to expose it. A flap can also be opened. In addition, different covering structures can be used.

8 Claims, 4 Drawing Sheets

FIG. 2B  FIG. 2C

COOLING SYSTEM FOR A PORTABLE DEVICE

BACKGROUND

The improvements in technology makes it possible for portable devices, such as portable phones, to do more. Power delivery mechanisms such as batteries improve. The processors and coprocessing circuits improve. The devices can do more as time goes on.

Electronic circuits in portable devices such as phones are often used to take, play and/or edit pictures, and/or take/play/edit videos. The circuitry in a phone or other device is also often used for the transmit and receive function. The processors are often used to carry out position detection, e.g., by GPS. Future telephones may also carry out a number of other features beyond these.

It is important to keep these portable telephones to small, so that they get reasonably good user acceptance.

SUMMARY

The present application teaches cooling systems and methods for a portable communication device such as a cellular phone.

BRIEF DESCRIPTION OF THE DRAWINGS

These and other aspects will now be described in detail with reference to the accompanying drawings, wherein:

FIGS. 2 and 2A-2D show embodiments with cooling orifices on edges of a cellular phone

DETAILED DESCRIPTION

The inventor recognizes that as the processing power and capability of a portable device gets more sophisticated, the heat penalty of the processing becomes more severe. Bigger batteries and better processors will create more of a heat penalty. As more is done in a portable device, more heat is created. As the different processing components get smaller, they can do more, but in so doing they still produce heat.

An embodiment describes applying these techniques to a portable phone. The desired form factor of a phone has made it difficult, the inventor recognizes, to effectively cool some of the internal components of the phone. That is, the desire to keep the phone style small and sleek has interfered with the ability to effectively cool the phone.

Moreover, it is desirable to avoid leaving openings that extend into the phone. This is because any opening into the phone allows water, air, dirt and the like to enter the phone and come into contact with the sensitive electronic components therein.

Figure 1A:
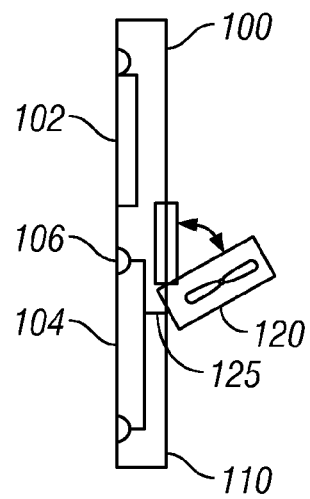
FIGS. 1A-1C show cellular telephone with a fold out fan in multiple positions.
Figure 1B:
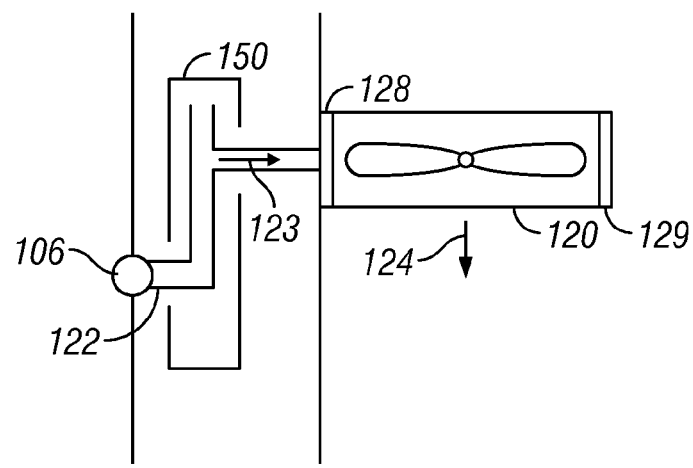
Figure 1C:
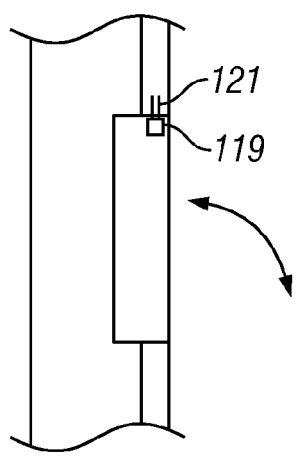

An embodiment cooling system for a cellular phone or other handheld device is illustrated in FIGS. 1A-1C. FIG. 1A shows the phone 100, with its screen 102, and keyboard 104. The phone also includes a number of vent holes 106. These vent holes 106 are relatively small holes, and may be selectively opened and closed using the techniques disclosed herein. The rear surface 110 of the phone includes a fold out fan 120 which is itself connected to an air duct 125. FIG. 1B illustrates a cutaway version of the phone showing the processor chip 150, although other circuitry within the phone that needs cooling can similarly be processed. The vent hole 106 main lead via an internal air duct 122 across the processor 150, to a fold out fan 120. The fan may fold completely out as shown in FIG. 1B, and blow air substantially in the direction of the arrow 124. As an alternative, the fan may blow air in the orthogonal direction.

The fan can open by spring force, for example. The fan is latched closed by the latch 121 holding against catch 119. When additional cooling is required, the catch 119 is electrically actuated to allow the fan's spring force to cause it to open. The spring force of the hinge then folds open the fan. The fan can be closed by a motor, or by a user folding closed the fan. If the phone is still overheating, for example, the latch might be still open, so that the fan cannot be kept closed.

The fold out fan can be on any surface of the phone, including on the side, bottom, or other. Two fans can fold out from opposite directions if desired.

As another embodiment, a cover for the fan may be provided, and that cover may be movable. The cover is movable to a first location that causes the fan to be exposed, and to a second location that covers the fan.

The air duct 122 is fluidically coupled to be cooled by the fan. For example, heat sinks 128, 129 may perform a heat sink function. In addition, the fan can be placed in a way that creates an air draft that sucks air through the air duct as generally shown as 123.

A fold out fan, when folded out, therefore can carry out significant amounts of cooling.

FIG. 1C illustrates how the fan may look when folded in. For example, the fan may be completely recessed into the body of the phone, or alternatively can slightly extend beyond the body in the area of the recess.

Figure 2:
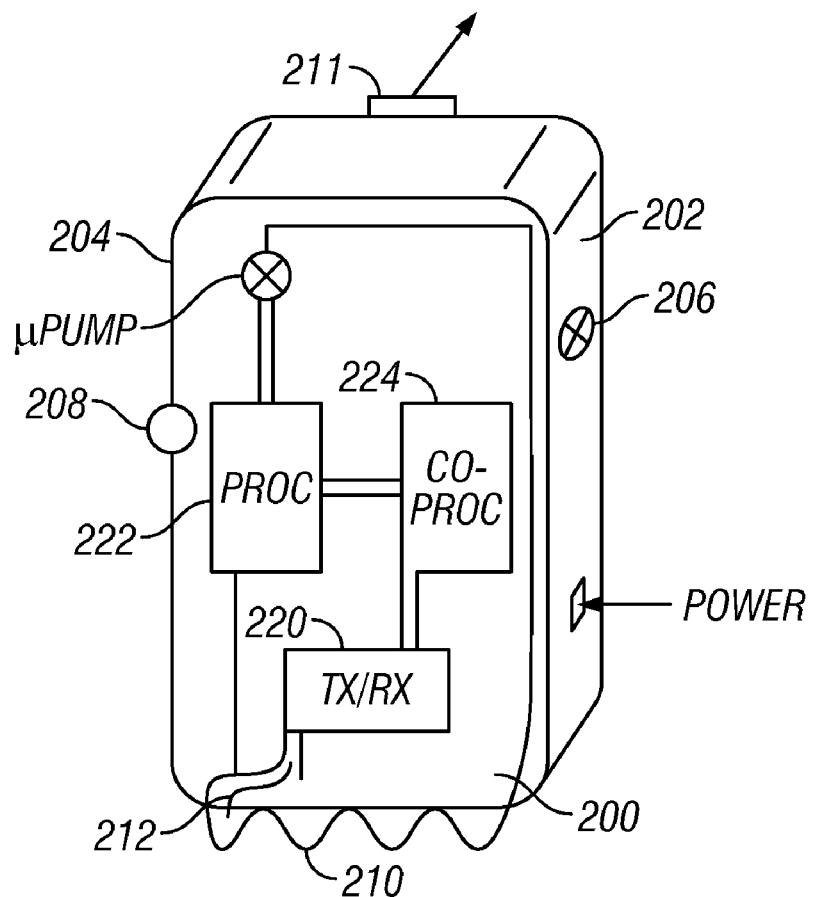
Figure 2A:
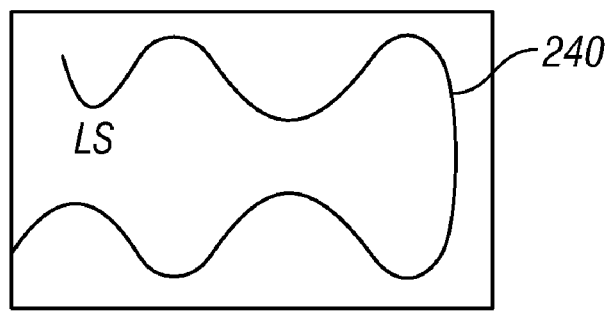
Figure 2D:
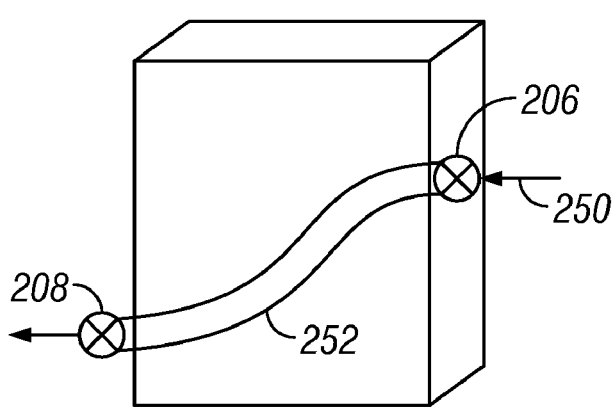
Figure 2D:
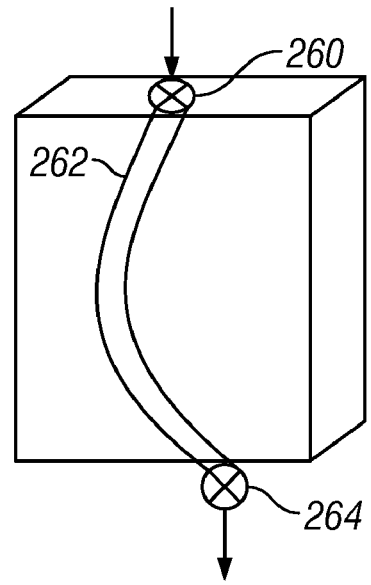
Figure 2D:
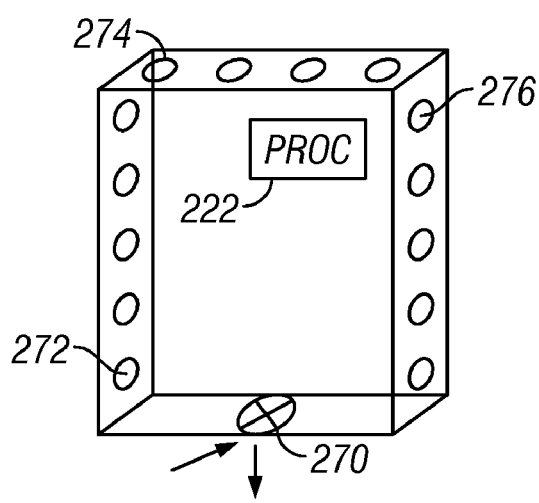

Another embodiment is shown in FIGS. 2-2D. In the FIG. 2 embodiment, there are a number of cooling structures associated with the body of the phone. The phone housing 200 has side surfaces 202 and 204. Each of these side surfaces may have a small fan therein, which may be recessed, or may be a fold out fan such as in FIG. 1. For example, the side surface 202 may have a fan 206. The side surface 204 may have a fan 208. The fans may operate, for example, in unison to cause an airflow through the phone.

Another cooling structure, shown as 210 may be located at the bottom of the phone. This cooler may simply have the structure shown in FIG. 2 and, for example have a cooling pipe 240 that follows a substantially serpentine path for cooling. For example, the copper pipe may include cooling fins. The pipe cooling system 210 may be connected via a passive cooling link such as 212 to the different operative heat producing structures such as the cellular transceiver.

Cellular transceiver 220, the processor 222 and co-processor 224. This may also be used to cool, for example, any bulb or lighting element that is used for backlighting. The embodiment in FIG. 2 may also have one or more folding and extending fan portions analogous to those shown in FIG. 1.

The fans 206, 208 may be used only when a thermal condition such as overheating is detected in one embodiment. In another embodiment, the supplemental cooling system is used only when external power is applied to the device.

By using a different cooling scheme for when external power is applied as compared when operating on batteries, several new paradigms become possible. For example, a first paradigm may allow certain phone functions to be used which might be considered too power hungry for normal phone operations. One example of this, for example, might be certain kinds of video rendering, or use of the phone to create a video that is coupled through an external port 211 to an external player. For example, these kinds of operations may be extremely power-hungry, and may be allowed only when external power is applied to the phone. At those times, the fans 206, 208 may also be operated.

FIG. 2B illustrates how the fans can direct air across the phone horizontally from one side to the other. The FIG. 2B embodiment shows the airflow in a non-straight line, with the air 250 drawn by the first fan 206 through a curved internal air duct 252 that extends from a portion near the top edge of the phone to a portion nearer to the bottom edge of the phone, and finally exhausted by the fan 208. This allows the fans to be operated very minimally, to save on power and to keep them quiet.

An alternative system shown in FIG. 2C may draw the air through a top-mounted fan 260, through a vertical vent 262 which again extends through different areas, and out a bottom end 264.

FIG. 2D illustrates another embodiment in which holes are provided on a number of different edge surfaces including the top edge surface, and the two side edge surfaces 204, 206. The air from those holes is exhausted by a bottom fan shown as 270. Holes such as 272 which are closer to the fan are smaller than holes such as 274 which are further from the fan. The biggest hole may be holes that are closest to heat producing devices such as the processor. Therefore, the hole sizes 276 are varied based on two separate variables: their proximity to heat producing devices, and their distance from the exhaust fan.

Figure 3:
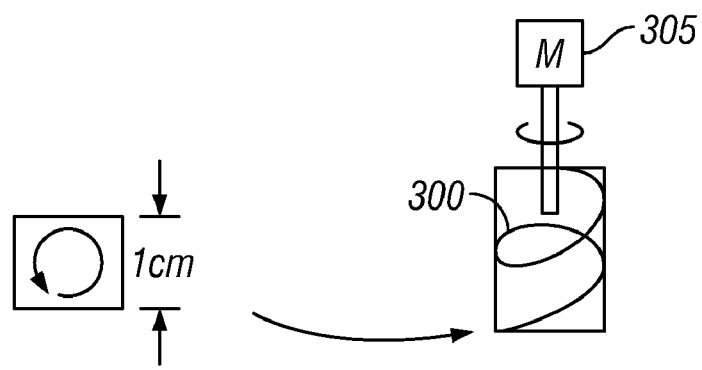
FIG. 3 shows a special spiral fan.

FIG. 3 shows a special fan which may be specifically usable within the cellular phone. Of course, other fans can also be used in the embodiments. A corkscrew-shaped element 300 is rotated by a motor 305 which may itself be powered by the cellular phone battery. The corkscrew has fan blades all along its length. Each fan blade 306, 307 is pitched in a direction to blow air (depending on a direction of turning). This blows air in and out of the phone.

In any of the embodiments described herein, including those described previously in those described further herein, a number of different improvements may be possible.

In any of the embodiments, the fan(s) may be for example periodically reversed, so that for example the fans 260, 264 may periodically change their directions; causing the air to flow down first for a period, then up for the next period. Since the fan itself uses energy, the fan may be driven at a duty cycle; for example, the fans may stay on for 1-30 seconds, and then turn off until the heat rebuilds to an unacceptable level. The next time they turn on, they can operate in the same direction as previously, or can operate for example in the opposite direction.

Another embodiment detects the location of the heat, for example in a sensed quadrant within which the heat is located, and operates the fans more aggressively that are in the location of the heat.

Figure 4A:
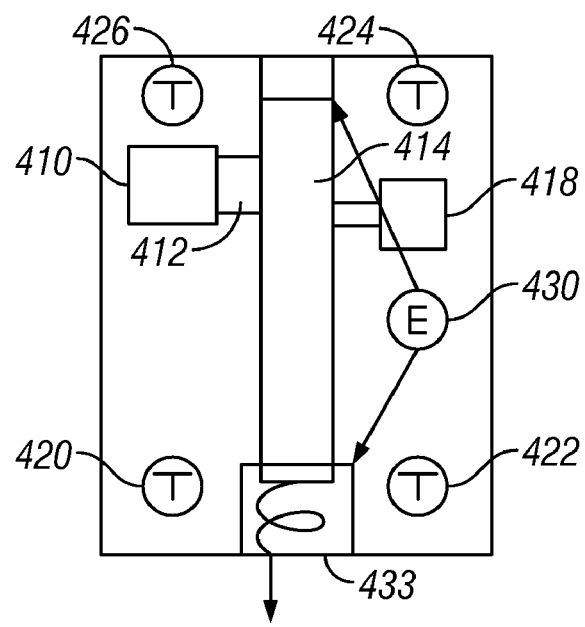
FIGS. 4A and 4B show multi-zone and multi-area cooling embodiments.
Figure 4B:
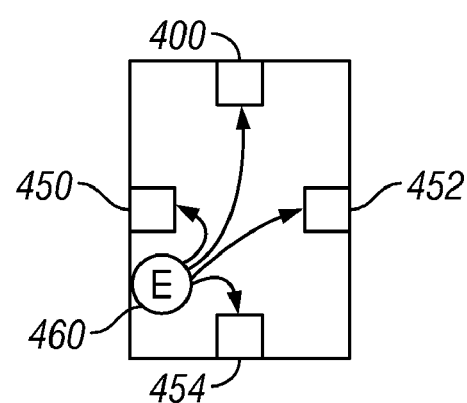

FIGS. 4A and 4B show another embodiment in which the openings are covered with a movable vent flap 400. The valve is opened and closed. When closed, the flaps keep the phone hermetically sealed. This may be the normal situation. The flaps can be electrically actuated to open them.

In an embodiment, the electronic device 410 includes a heatsink 412 which may be active or passive. Heatsink 412 is coupled to a copper heat line 414. Another heatsink, such as 418 is also coupled to the copper line 414. The copper line may include fins therein or the like. A number of temperature sensing devices may be provided shown as 420, 422, 424 and 426. While four temperature sensing devices are shown, it should be understood that there can be only two or only one device. The fans is normally closed, and operated by an electronic controller shown as 430. The controller senses the temperatures from the temperature sensing devices 420-426. When the temperature gets too high, the controller substantially simultaneously opens the valves 400 and also turns on the fan 433. This causes the air to be sucked in through the vent, and drawn down through the phone.

Another advantage of this kind of separate cooling structure is that different areas, e.g., the first areas and second areas, may require different amounts of cooling. For example when higher heat producing elements are in the second and areas or when the high heat part or when there is some structure in the second area that requires to be kept cooler, it can be separately cooled. By separately cooling this part, the noise and power can be minimized.

In an embodiment, when the temperature at the bottom (420/422) is higher than the temperature at the top (424/426) then the fan may draw air from the bottom to the top. Conversely, when the temperature at the top is higher, then the fan 433 may be reversed and may draw air from the top to the bottom.

This embodiment shows the use of the corkscrew fan 433, although it should be understood that any other kind of bladed fan or any other type of fan could be used for this purpose.

An alternative embodiment, shown in FIG. 4B, may have a number of different openable and closable flaps, including or in addition to the vent 400, may also have fans 450, 452, 454. The electronic controller 460 opens all the vents when needed, and otherwise closes them for hermetic sealing.

As an alternative, each flap or other cooling device may be close to a temperature sensing device, and event might only be opened when the temperature near that vent gets hot. At that time, purely passive cooling can be used, or alternatively any of the fans of any of the three embodiments can be used. In addition, any of these fans can be used in a duty cycle mode, where they are on for backs of seconds, and then all for wise sessions. That duty cycle, for example, is preferably shortened when the rate of change if he starts to increase. For example, a duty cycle control may turn the fan on just long enough to exhaust the built up heat in the unit, after which the heat can again start building.

The general structure and techniques, and more specific embodiments which can be used to effect different ways of carrying out the more general goals are described herein.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, while the above describes cooling a cellular phone, other devices can be cooled in this way.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be an Intel (e.g., Pentium or Core 2 duo) or AMD based computer, running Windows XP or Linux, or may be a Macintosh computer. The computer may also be a laptop.

The programs may be written in C or Python, or Java, Brew or any other programming language. The programs may be resident on a storage medium, e.g., magnetic or optical, e.g.

the computer hard drive, a removable disk or media such as a memory stick or SD media, wired or wireless network based or Bluetooth based Network Attached Storage (NAS), or other removable medium or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

What is claimed is:

1. A portable electronic device, comprising:
    a housing, having at least one electrically operated device therein, said housing having at least one operating condition during which said electrically operated device is being operated,
    a sensor that detects an overheating condition within said housing; and a cooler moving part, that moves at least a part associated with a cooler to a different physical location responsive to said sensor detecting said overheating condition, in order to cool within said housing, wherein said sensor includes at least a first sensor part and a second sensor part, said first sensor part detecting a temperature in a first location in said housing, and said second sensor part detecting a temperature in a second location in said housing different than said first location,
    a cooler moving part that moves a first cooler part responsive to said first sensor part detecting a first overheating temperature in said first location, but does not move said first cooler part when said first overheating temperature is not detected in said first location, and said cooler moving part moves a second cooler part responsive to detecting a second overheating temperature in said second location, but does not move said second cooler part when said second overheating temperature is not detected in said second location.

2. A device as in claim 1 wherein said first cooler part is a flap that opens and closes, said flap being adjacent an opening in said housing, and when said flap is open, said opening communicates an inside of said housing with an outside, and when said flap is closed, said opening is blocked from communicating said inside of said housing with said outside.

3. A device as in claim 1, wherein said first cooler part is a part that moves a fan part that is associated with a fan.

4. A portable electronic device, comprising:
    a housing, having at least one electrically operated device therein, said housing having at least one operating condition, during which said electrically operated device is being operated;
    a sensor that detects an overheating condition within said housing; and
    a cooler moving part, that moves at least a part associated with a cooler to a different physical location responsive to said sensor detecting said overheating condition in said housing in order to cool within said housing, wherein said cooler moving part moves said part responsive to detecting said overheating condition in said housing, but does not move said part when said overheating condition is not detected in said housing,
    wherein said sensor includes at least a first sensor part and a second sensor part, said sensor first part detecting a temperature in a first location in said housing, and said second sensor part detecting a temperature in a second location in said housing different than said first location,
    wherein said cooler moving part moves a first cooler part responsive to said first sensor part detecting a first overheating temperature in said first location, but does not move said first cooler part when said first overheating temperature is not detected in said first location, and said cooler moving part moves a second cooler part responsive to detecting a second overheating temperature in said second location, but does not move said second cooler part when said second overheating temperature is not detected in said second location.

5. A device as in claim 4 wherein said first cooler part is a flap that opens and closes, said flap being adjacent an opening in said housing, and when said flap is open, said opening communicates an inside of said housing with an outside, and when said flap is closed, said opening is blocked from communicating said inside of said housing with said outside.

6. A device as in claim 5, wherein said first cooler part is a part that moves a part that is associated with a fan.

7. A device as in claim 1, in which said housing is substantially sealed and prevents exchange with an area outside said housing when both said first cooler part and said second cooler parts are in closed positions.

8. A device as in claim 4, in which said housing is substantially sealed and prevents exchange with an area outside said housing when both said first cooler part and said second cooler parts are in closed positions.

* * * * *